United States Patent
Yudanov et al.

(10) Patent No.: US 11,604,754 B2
(45) Date of Patent: Mar. 14, 2023

(54) METHOD AND APPARATUS OF INTEGRATING MEMORY STACKS

(71) Applicant: Advanced Micro Devices, Inc., Sunnyvale, CA (US)

(72) Inventors: Dmitri Yudanov, Austin, TX (US); Michael Ignatowski, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 146 days.

(21) Appl. No.: 15/605,291

(22) Filed: May 25, 2017

(65) Prior Publication Data

US 2018/0341613 A1    Nov. 29, 2018

(51) Int. Cl.
| | |
|---|---|
| *G06F 13/16* | (2006.01) |
| *G06F 13/40* | (2006.01) |
| *G11C 29/02* | (2006.01) |
| *G11C 29/30* | (2006.01) |
| *G11C 29/44* | (2006.01) |
| *G11C 5/02* | (2006.01) |
| *G11C 5/06* | (2006.01) |
| *G11C 5/14* | (2006.01) |
| *G11C 7/06* | (2006.01) |
| *G11C 7/10* | (2006.01) |

(52) U.S. Cl.
CPC ...... *G06F 13/4068* (2013.01); *G06F 13/1668* (2013.01); *G11C 5/02* (2013.01); *G11C 5/06* (2013.01); *G11C 5/147* (2013.01); *G11C 7/06* (2013.01); *G11C 29/30* (2013.01); *G11C 29/44* (2013.01); *G11C 7/1012* (2013.01); *G11C 29/025* (2013.01)

(58) Field of Classification Search
None
See application file for complete search history.

(56) References Cited

U.S. PATENT DOCUMENTS

| | | | |
|---|---|---|---|
| 9,432,298 B1 * | 8/2016 | Smith | H04L 49/9057 |
| 2007/0286009 A1 | 12/2007 | Norman | |
| 2010/0195363 A1 | 8/2010 | Norman | |
| 2014/0013185 A1 | 1/2014 | Kobla et al. | |
| 2014/0177626 A1 | 6/2014 | Thottethodi et al. | |
| 2015/0348613 A1 | 12/2015 | Vogelsang | |

* cited by examiner

*Primary Examiner* — Idriss N Alrobaye
*Assistant Examiner* — Dayton Lewis-Taylor
(74) *Attorney, Agent, or Firm* — Volpe Koenig

(57) ABSTRACT

A method and apparatus of integrating memory stacks includes providing a first memory die of a first memory technology and a second memory die of a second memory technology. A first logic die is in communication with the first memory die of the first memory technology, and includes a first memory controller including a first memory control function for interpreting requests in accordance with a first protocol for the first memory technology. A second logic die is in communication with the second memory die of the second memory technology and includes a second memory controller including a second memory control function for interpreting requests in accordance with a second protocol for the second memory technology. A memory operation request is received at the first or second memory controller, and the memory operation request is performed in accordance with the associated first memory protocol or the second memory protocol.

44 Claims, 6 Drawing Sheets

METHOD AND APPARATUS OF INTEGRATING MEMORY STACKS

STATEMENT REGARDING FEDERALLY SPONSORED RESEARCH

This invention was made with Government support under FastForward-2 Memory Technology (MT) Project with Lawrence Livermore National Laboratory (Prime Contract No. DE-AC52-07NA27344, Subcontract No. B608045) awarded by DOE. The Government has certain rights in this invention.

BACKGROUND

Extending capacity of a memory system is an important feature to allow faster reads and writes to a memory stack. However, there are different types of memory technologies (e.g., dynamic random access memory (DRAM), phase-change memory (PCM), Flash memory, static random access memory (SRAM), among other) that do not utilize the same protocols to communicate with a processor.

Accordingly, conventional approaches to stacking memory limit the ability to extend the stack height and capacity. Additionally, the yield loss from final testing of memory chips in a stack are high because the testing is performed after the chips are bonded to a base logic chip. This approach to testing is done due to the complexity of handling a large number of memory channels within the stack.

Conventional memory stacks do not, therefore, include memory chips comprised of more than one technology in the memory stack.

BRIEF DESCRIPTION OF THE DRAWINGS

A more detailed understanding can be had from the following description, given by way of example in conjunction with the accompanying drawings wherein.

DETAILED DESCRIPTION

Figure 1:
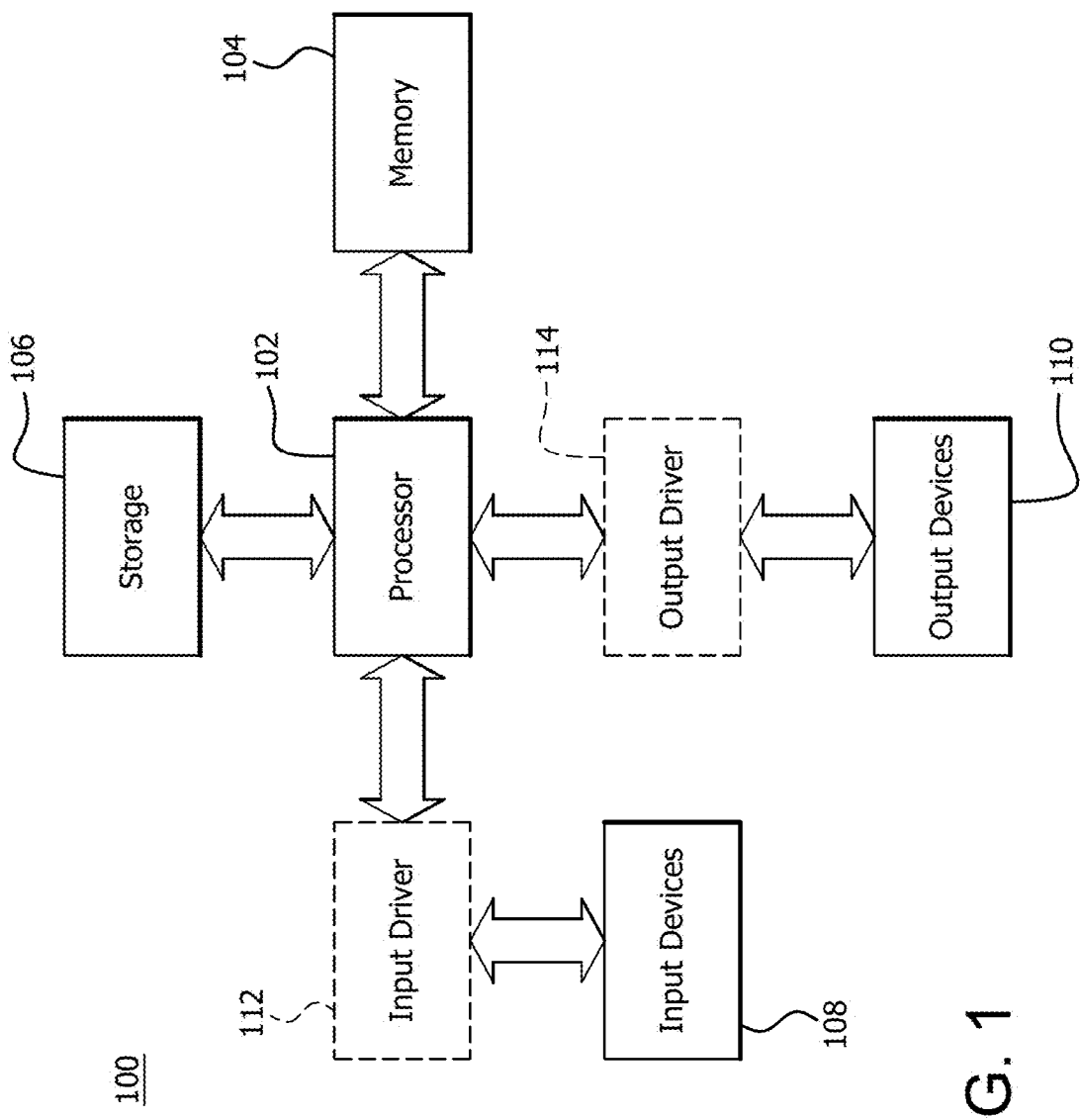
FIG. 1 is a block diagram of an example device in which one or more disclosed embodiments can be implemented.

The technology trend relating to processor architectures tends towards tighter integration of the compute unit (e.g., processor) and stacked memory. An example of this can be found with the integration of high bandwidth memory (HBM) with a graphics processing unit (GPU) on the same package. With conventional technology, the capacity of stacked memory is a limiting factor for many uses of this integrated approach. It would be therefore advantageous to increase the capacity of stacked memory. For example, a modular approach as described herein can include assembling memory segments into a stack to be provided for a system on chip (SOC) build process.

Additionally, assembly of high capacity memory stacks may be performed during the SOC build process by combining multiple modular segments without the need to rely on completely pre-assembled memory stacks. Although more detail is provided below, briefly integration and memory control functions are utilized by way of a gasket die, which includes a memory controller to interface with memory chips of one or more technologies.

Additionally, switching, error correction, wear leveling, and compute functionality, such a processor in memory (PIM) technique can be included in the gasket die. The memory controller on the gasket die includes, for example, options ranging from implementing a full memory controller, to implementing interface functions to associated memory chips with the majority of the memory control functions contained on a separate processor die.

A method of integrating memory stacks is disclosed. The method includes providing a first memory die of a first memory technology and a second memory die of a second memory technology. A first logic die is in communication with the first memory die of the first memory technology, and includes a first memory controller including a first memory control function for interpreting requests in accordance with a first protocol for the first memory technology. A second logic die is in communication with the second memory die of the second memory technology and includes a second memory controller including a second memory control function for interpreting requests in accordance with a second protocol for the second memory technology. A memory operation request is received at the first or second memory controller, and the memory operation request is performed in accordance with the associated first memory protocol or the second memory protocol.

An apparatus is disclosed. The apparatus includes a first memory die of a first memory technology and a first logic die in communication with the first memory die of the first memory technology, and a second memory die of a second memory technology and a second logic die in communication with the second memory die of the second memory technology. The first logic die includes a first memory controller that includes a first memory control function for interpreting requests in accordance with a first protocol for the first memory technology. The second logic die includes a second memory controller that includes a second memory control function for interpreting requests in accordance with a second protocol for the second memory technology. The first or second memory controller receives a memory operation request and performs the memory operation request in accordance with the associated first memory protocol or the second memory protocol.

A method of testing memory is disclosed. The method includes providing a first memory die of a first memory technology, and a first logic die in communication with the first memory die of the first memory technology. The first logic die includes testing logic for testing memory areas in accordance with a first protocol for the first memory technology, and performs a test on memory areas included in the first memory die of the first memory technology to identify failed memory areas.

FIG. 1 is a block diagram of an example device 100 in which one or more disclosed embodiments may be implemented. The device 100 may include a computer, for example, a desktop computer, a tablet computer, a gaming device, a handheld device, a set-top box, a television, or a mobile phone. The device 100 includes a processor 102, a memory 104, a storage 106, one or more input devices 108, and one or more output devices 110. The device 100 may also optionally include an input driver 112 and an output driver 114. It is understood that the device 100 may include additional components not shown in FIG. 1.

The processor 102 may include a central processing unit (CPU), a GPU, a CPU and GPU located on the same die, or one or more processor cores, wherein each processor core may be a CPU or a GPU. The memory 104 may be located on the same die as the processor 102, or may be located separately from the processor 102. The memory 104 may include a volatile or non-volatile memory, for example, random access memory (RAM), dynamic RAM (DRAM), or a cache.

The storage 106 may include a fixed or removable storage, for example, a hard disk drive, a solid state drive, an optical disk, or a flash drive. The input devices 108 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 may include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. Although described embodiments include a main display, the invention may be practiced without a main display. In this way, the control territory may be an office environment with a plurality of portable devices and no main display.

Figure 2:
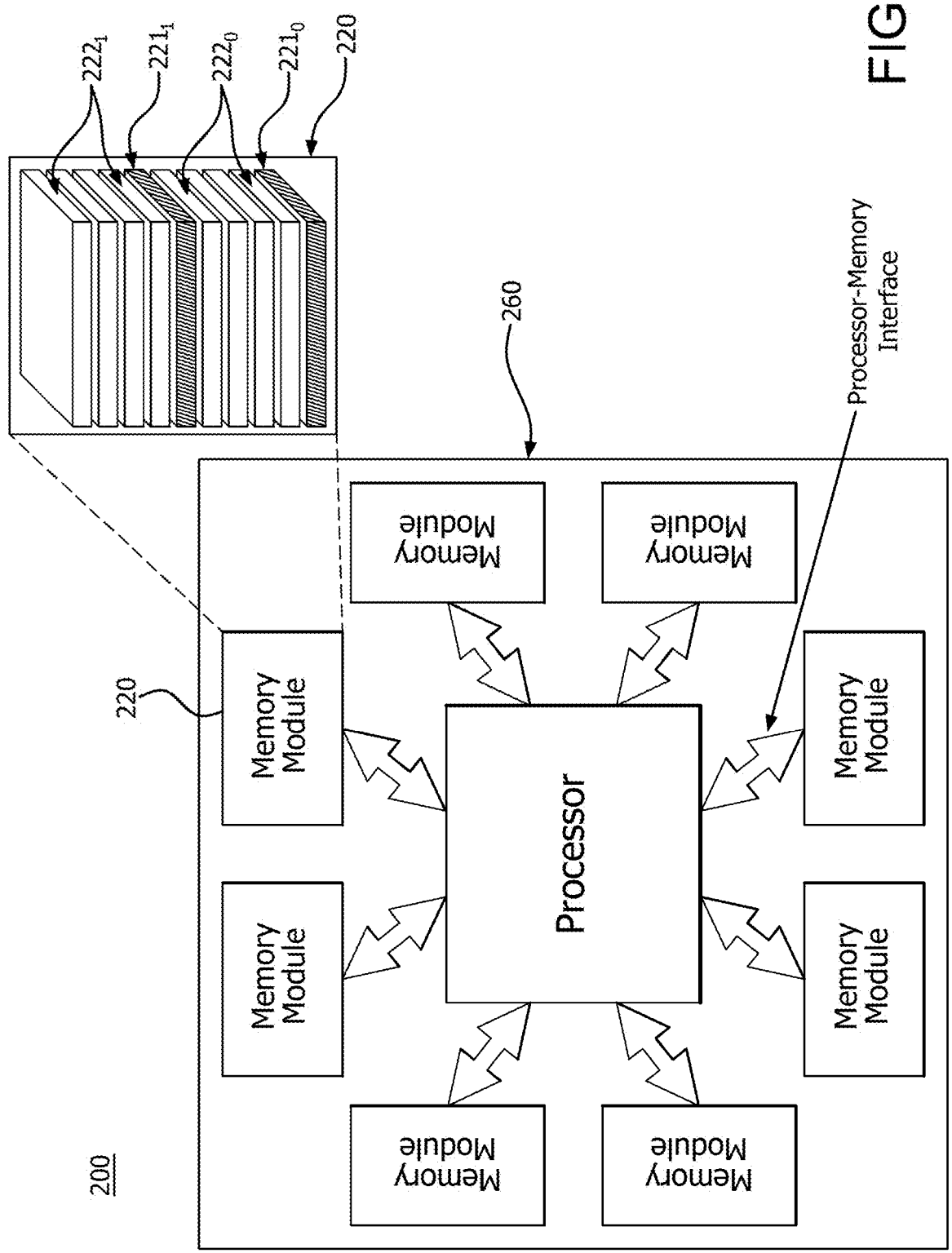
FIG. 2 is a block diagram of an example structure of a processor in communication with a plurality of memory stacks in which one or more features of the disclosure can be implemented.

FIG. 2 is a block diagram of an example structure 200 of a processor in communication with a plurality of memory stacks 220 (which can also be referred to as memory modules) in which one or more features of the disclosure can be implemented. FIG. 2 depicts, for example, the processor (e.g., processor 102) in communication with memory stacks 220 via a processor-memory interface. In FIG. 2, an example memory stack 220 is depicted as including logic dies 221 (designated $221_0$ and $221_1$) and one or more memory dies 222 (designated $222_0$ and $222_1$). In the example structure 200, the processor and memory modules 220 are shown disposed in a ring structure, where the memory modules 220 are situated around the processor in a ring pattern. However, it should be noted that the memory modules 220 can be disposed in any manner, and not necessarily in a ring pattern.

As shown in FIG. 2, the logic die $221_0$ is disposed beneath memory dies $222_0$, which can be considered a first memory sub-stack (i.e., logic die $221_0$ and memory dies $222_0$ together), while logic die $221_1$ is disposed above memory dies $222_0$ and beneath memory dies $222_1$, which can be considered as a second memory sub-stack (i.e., logic die $221_1$ and memory dies $222_1$ together). It should be noted that although 2 logic dies 221 and 8 total memory dies 222 are depicted in FIG. 2, additional groupings can be included above the memory dies $222_1$. For example, 16, 32 or 64 memory dies 222 could be included in a memory stack 220, as well as additional logic dies 221 for controlling additional stacked groups of memory dies 222. The memory dies 222 can be of varying memory technologies as described above, or can include all, or subgroups, of the same memory technology.

Figure 3C:
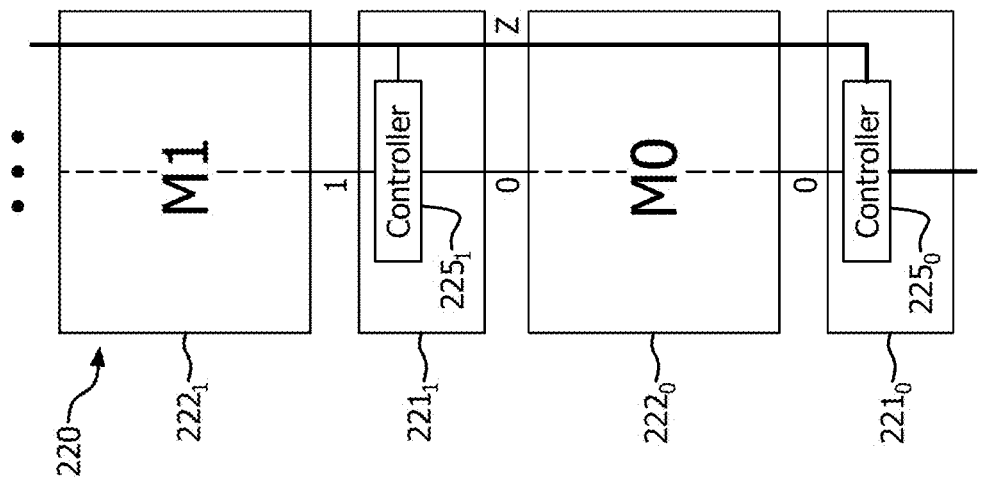
FIG. 3C is a block diagram of an example structure of a memory stack depicted in FIG. 2 arranged in a third configuration.
Figure 3B:
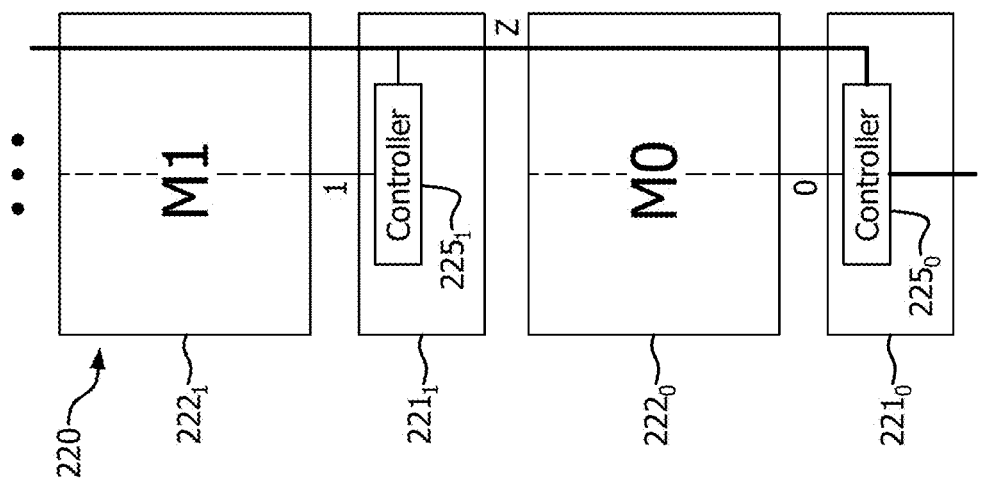
FIG. 3B is a block diagram of an example structure of a memory stack depicted in FIG. 2 arranged in a second configuration.
Figure 3A:
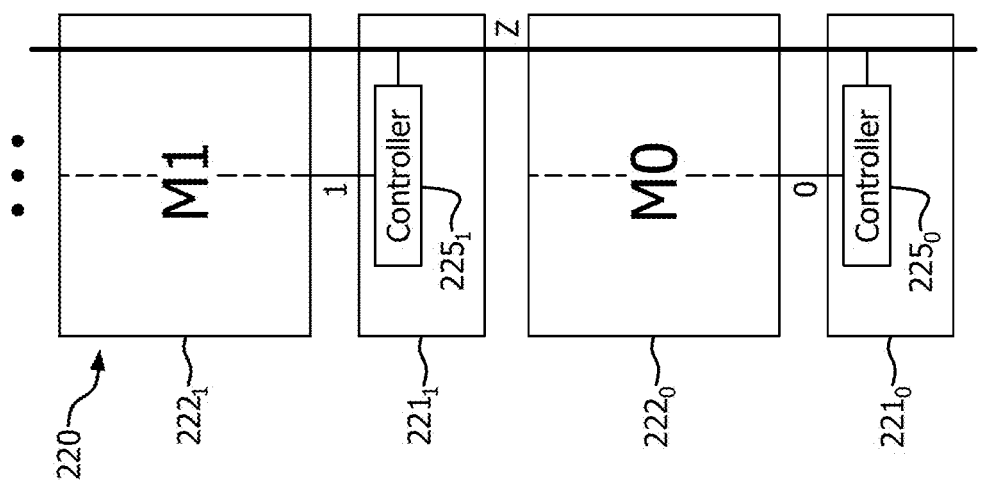
FIG. 3A is a block diagram of an example structure of a memory stack depicted in FIG. 2 arranged in a first configuration.

FIG. 3A is a block diagram of an example structure of a memory stack 220 depicted in FIG. 2 arranged in a first configuration. In the configuration shown in FIG. 3A, logic die $221_0$ includes a memory controller $225_0$ and logic die $221_1$ includes a memory controller $225_1$. As shown in the configuration in FIG. 3A, memory controller $225_0$ is in communication with memory dies $222_0$ (memory segment M0) along the connection 0 depicted as well as a sidebus designated bus Z. Memory controller $225_1$ is in communication with memory dies $222_1$ (memory segment M1) along the connection 1 depicted as well as the sidebus designated bus Z. Sidebus Z in FIG. 3A proceeds through each memory segment M0 and M1 to connect to each memory controller 225 individually on one end, and to, for example the processor (e.g., processor 102) via the processor-memory interface. In this manner, each individual memory controller 225 communicates with the processor via the sidebus Z as well as to its memory segment that it controls. Again it should be noted that although only two memory segments (M0 and M1) are depicted, any number of memory segments can be included, thus depicted by sidebus Z extending above memory segment M1. Although sidebus Z is depicted as running along a side of each memory technology, it should be noted that sidebus Z can take any physical path.

Since each memory segment M0 and M1 may have its own protocol, the memory controller 225 for that memory segment includes some portion of standard memory controller functionality, such as how to interpret the protocols and commands for that memory technology to perform reads and writes to that memory segment to allow communication to that memory segment via the sidebus Z. This aids in limiting the number of through silicon vias (TSVs) in that the sidebus Z need only be connected to the controller 225 in each logic die 221, as opposed to channels needing to be provided to connect the sidebus Z to every memory area in every memory segment.

FIG. 3B is a block diagram of an example structure of a memory stack 220 depicted in FIG. 2 arranged in a second configuration. In the configuration shown in FIG. 3B, logic die $221_0$ includes a memory controller $225_0$ and logic die $221_1$ includes a memory controller $225_1$. As shown in the configuration in FIG. 3B, memory controller $225_0$ is in communication with memory dies $222_0$ (memory segment M0) along the connection 0 depicted as well as a sidebus designated bus Z. Memory controller $225_1$ is in communication with memory dies $222_1$ (memory segment M1) along the connection 1 depicted as well as the sidebus designated bus Z. However, sidebus Z in FIG. 3B proceeds only between memory controller to memory controller in each logic die 221. That is, the sidebus Z proceeds from controller $225_0$ in logic die $221_0$ to controller $225_1$ in logic die $221_1$ and to any additional controllers 225 in any additional logic dies 221. In this configuration, only memory controller $225_0$ is in communication with a processor, such as processor 102. All other memory controllers, such as controller $225_1$, communicate off stack by first communicating with controller $225_0$. Accordingly, controller $225_0$ acts as a master controller for that entire memory stack 220.

FIG. 3C is a block diagram of an example structure of a memory stack 220 depicted in FIG. 2 arranged in a third configuration. In this configuration, similar to the second configuration depicted in FIG. 3B, the controller $225_0$ acts as a master controller in that it alone is in communication with any components off the memory stack, such as processor 102. However in this configuration, the memory controllers 225 of intermediary logic dies 221, such as memory controller $225_1$ of logic die $221_1$ are in communication with not only the memory segment above, but also the one below. For example, as shown in FIG. 3C, controller $225_1$ is in communication with both M0 and M1.

In this manner, one memory segment can be utilized for a first type of functionality while a second memory segment can be utilized for a second type of functionality. For example, if M1 is a slower accessing non-volatile memory technology and M0 is a fast accessing DRAM, M0 can be utilized as a cache for M1 above it. Accordingly, the most utilized data of M1 is transferred to M0 by the controller $225_1$, which is in communication with M0 and M1, and is cached in M0. In this way, instead of transferring data for caching from M1 to controller $225_0$, and then up to M0, controller $225_1$ directly accesses the desired data from M1 and transfers it directly to M0, bypassing the sidebus Z. That is, controller $225_1$ is able to control both M0 and M1.

Each logic die 221 depicted in FIGS. 3A-3C can also provide alignment of TSVs between memory technologies. That is, the TSVs for one memory technology may be at a different pitch or arranged differently than those for another technology. Accordingly, it can be difficult to connect wires from one chip below to another chip above without first aligning the TSVs. This alignment is performed by the logic die 221 disposed between the technologies. Accordingly, each logic die/gasket 221 is made of metal layers. In complementary metal-oxide semiconductor (CMOS) technology, a chip includes at least one transistor layer and a plurality of metal layers for conduction of signals. A physical mask is overlayed that aligns the TSVs for one technology to another technology to provide realignment for the metal layer. A redistribution layer can also be included to align TSVs for similar technologies.

Figure 4:
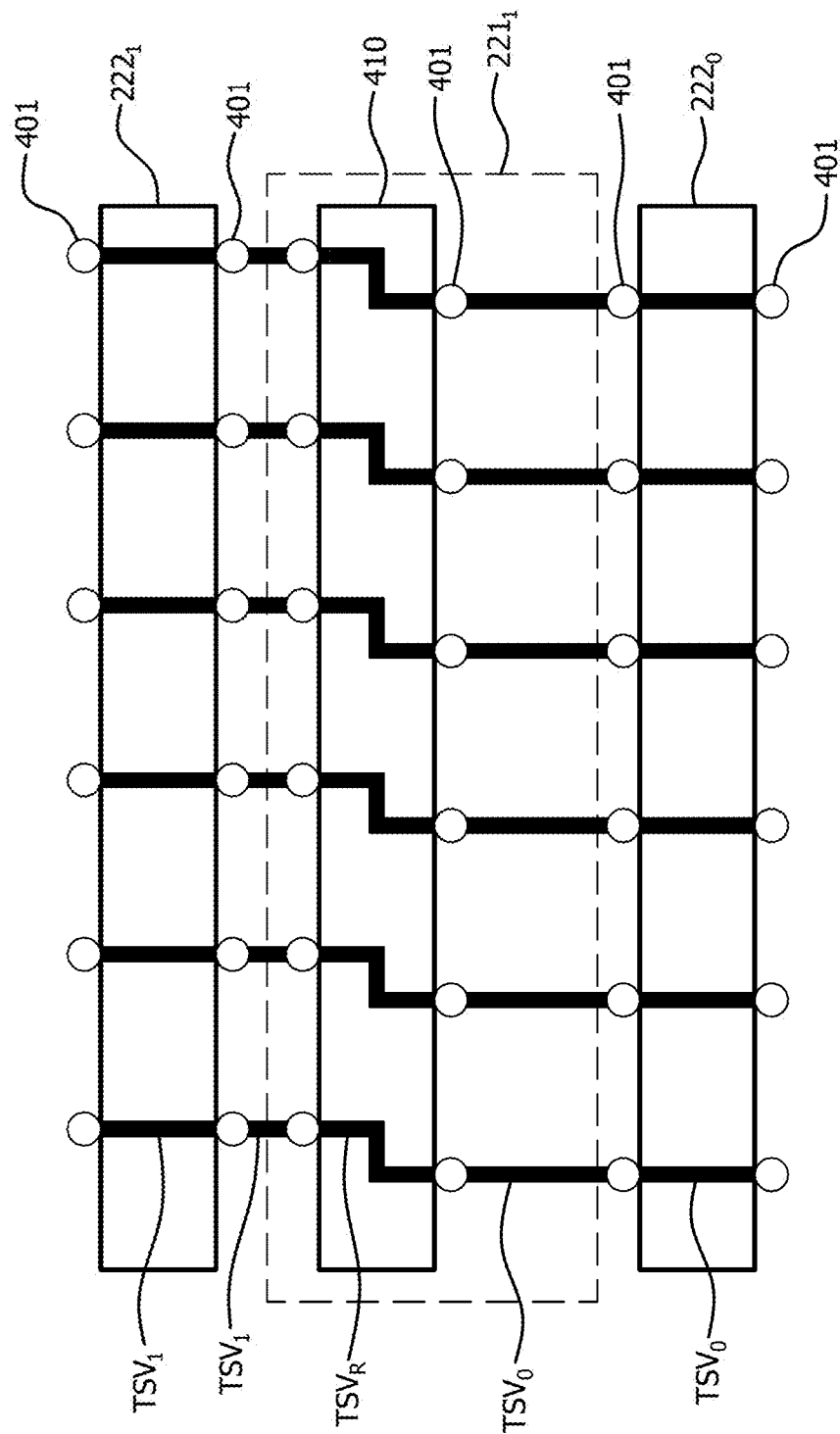
FIG. 4 is a block diagram of an example structure of a partial memory stack including a through silicon via (TSV) realignment.

FIG. 4 is a block diagram of an example structure of a partial memory stack 400 including a TSV realignment. The partial memory stack 400 depicts a memory die $222_0$ of a first memory technology, an intermediary logic die $221_1$, and a memory die $222_1$ of a second memory technology. A mask layer 410 is depicted in the logic die $221_1$. A plurality of connections 401 are shown on the top and bottom of each die, as well as the top and bottom of the mask layer 410. These connections 401 allow for signals to be transferred to and from the dies. As depicted in FIG. 4, a number of TSVs are shown transiting from the bottom to the top of each component depicted from a bottom connection 401 to a top connection 401 of the component. For purposes of example, each connection 401 (i.e., top or bottom) for each component is also a connection for the next component above or below it.

Each memory technology can include a different arrangement of TSVs. For example, memory die $222_0$ shows an arrangement of TSVs (labeled $TSV_0$) that are different from the arrangement of TSVs for memory die $222_1$ (labeled $TSV_1$). Accordingly, the TSVs for memory die $222_0$ are not aligned with the TSVs for memory die $222_1$. The mask layer 410, therefore, includes, for example, TSVs (labeled $TSV_R$), which realign the TSVs for memory die $222_0$ with the TSVs for memory die $222_1$. It should be noted that the mask layer 410 is shown for purposes of example as a physical layer within the logic die $221_1$. However, the mask layer 410 can be located in any layer between the memory dies $222_0$ and $222_1$ in order to realign the TSVs of each. Additionally, as noted, the mask layer can also be a redistribution layer that does not perform realignment, but simply ensures alignment of TSVs for similar memory technologies.

Figure 5:
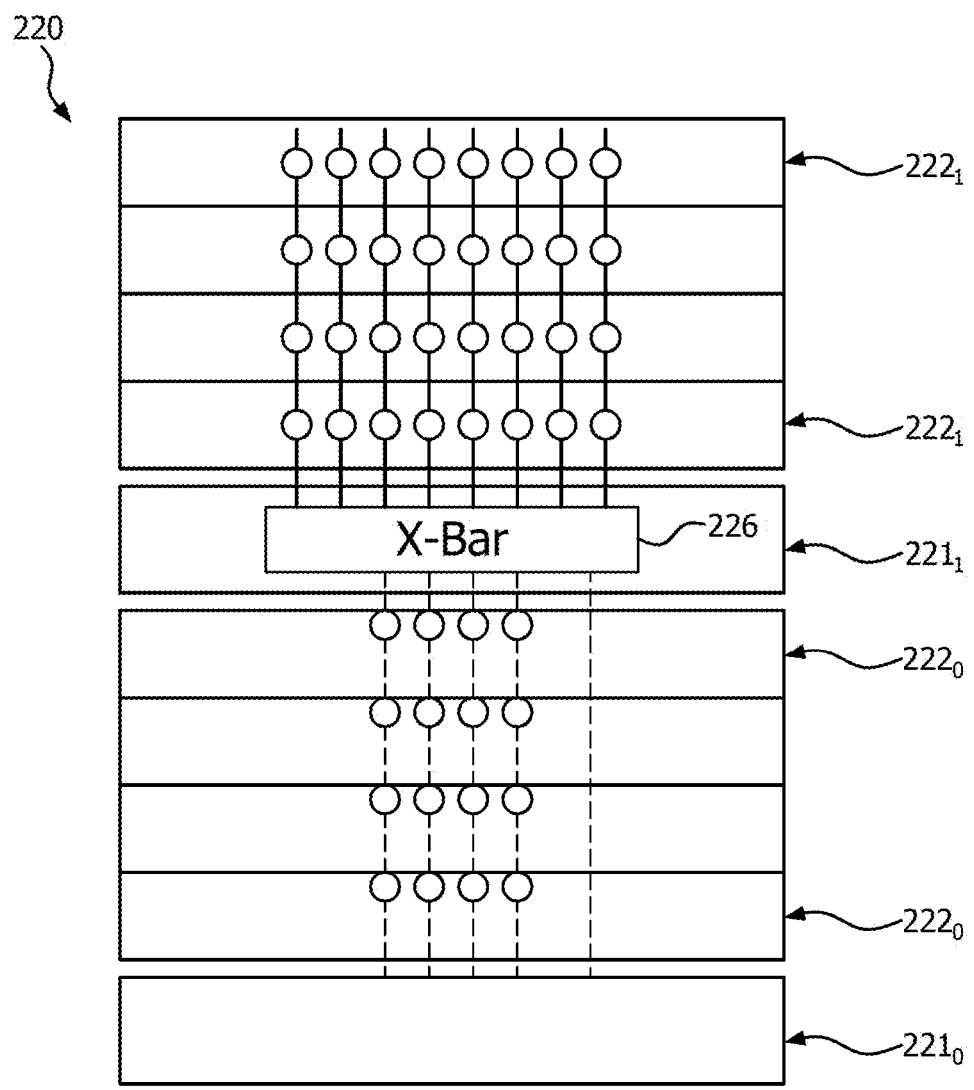
FIG. 5 is a block diagram of an example structure of a memory stack depicted in FIG. 2 including a crossbar.

Additional functionality for each logic die 221 is provided in the form of a crossbar (X-bar), or other interconnect for connecting one or more memory areas of one memory die 222 to one or more areas of another memory die 222. FIG. 5 is a block diagram of an example structure of a memory stack 220 depicted in FIG. 2 including a crossbar 226. As depicted in FIG. 5, the crossbar 226 is included in an intermediary logic die (e.g., $221_1$). This arrangement is similar to the arrangement of FIG. 3C, although not all components shown in FIG. 3C are depicted. That is, the logic die $221_0$ includes a controller $225_0$ that acts as a master memory controller.

However, in order to transfer data from any location in a memory die of one memory segment (e.g., $222_0$) to any location on another memory die of another memory segment (e.g., $222_1$), the crossbar 226 in the intermediary logic die $221_1$ allows the transfer of that data from any location in one memory segment to any location in any other memory segment. It should be noted that although a crossbar (e.g., crossbar 226) is shown to provide this functionality, any type of switch that performs such functionality may be utilized. In this manner, similar to that described in FIG. 3C, where memory segment $222_0$ is utilized as a cache for memory segment $222_1$, the cached data can be quickly transferred via the crossbar 226 from any location in one memory segment to any location in another memory segment. Additionally, although only one crossbar 226 is shown, it is noted that additional memory segments above memory segment $222_1$ can also include a logic die 221 that includes a crossbar 226 to facilitate data transfer to and from memory segments above and below one another.

Figure 6:
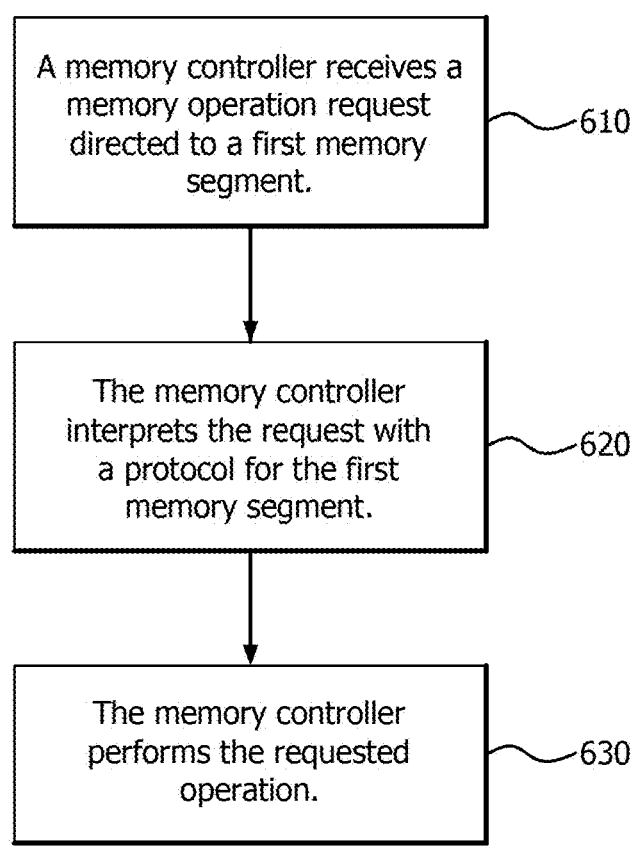
FIG. 6 is a flow diagram of an example method of performing a memory operation in memory stacks.

With regard to providing memory access to a memory segment, FIG. 6 is a flow diagram of an example method 600 of performing a memory operation in memory stacks. In step 610, a memory operation request directed to a first memory segment is received by a memory controller. Referring back to FIGS. 2 and 3A-3C, the request can be sent from a processor (such as processor 102) to memory segment M1. In the case of FIG. 3A, the memory controller $225_1$ receives the request. In the case of FIG. 3B or 3C, the memory controller $225_0$ receives the request.

Once the memory controller receives the request, the memory controller interprets the request with a protocol for that first memory segment (step 620). That is, again, referring back to FIG. 3A, memory controller $225_1$ interprets the request in accordance with the memory protocol of the type of memory that segment M1 is (e.g., PCM) in order to properly perform a read/write or other memory function that is requested. In the case where there is a master memory controller (e.g., in FIG. 3C), that master memory controller routes the request to the proper memory controller based on the address range of the request via a control signal that includes information as to which controller should receive the request.

Once the request is interpreted, the memory controller performs the operation (step 630). For example, in FIG. 3A, memory controller $225_1$ performs the read/write operation as requested and transfers data to or from memory segment M1 from or to the processor (e.g., processor 102) via the sidebus Z.

An additional feature of segmenting memory segments (such as M0 and M1) is that testing can be performed on the memory prior to assembling the entire memory stack. For example, logic is included in each logic die 221 such that it tests the memory segment (e.g., M0 tested by logic die $221_0$) above it and associated with it. In this manner, larger memory stacks can be assembled (e.g., 32 chips high or 64 chips high) with a logic die 221 between a grouping of memory dies 222. That is a logic die 221 can be placed between a group of 8 memory dies 222, 4 memory dies 222, or the like. Once a sub-stack is verified as good, it could then be placed upon another good sub-stack.

In another example, testing is performed post-assembly. That is, each logic die 221 tests the memory segments associated with it (e.g., M0 tested by logic die $221_0$). Should a problem be detected in any of the memory dies 222 associated with that logic die 221, that memory die 222 or the entire sub-stack can be disabled for memory operations. The test performed can be in accordance with a built in self-test, a boundary scan, a test in accordance with a joint test action group (JTAG) or Institute of Electrical and Electronics Engineers (IEEE) test.

In addition to the functionality described, each logic die 221 can include compute logic, such as processor in memory (PIM) logic to allow computations to be performed on data that is stored in the memory segments associated with the logic die. For example, data in memory segment M1 in FIGS. 3A-3C can be operated on by a processor (not shown) in communication with the memory controller $225_1$ and encoded/decoded, compressed, or have other computations performed on it. In this manner, data computation can proceed more quickly by having some computations performed by the PIM in each logic die 221 rather than provide the data to a more central processor, such as processor 102, for computation. If PIM logic is included, it can be included in some or all of the logic dies 221. Furthermore, each logic die 221 can include repeaters, or amplifiers, so that a signal needing to be transmitted further along in a stack can be transmitted without diminishing. Voltage regulators can also be included in each logic die 221 to compensate for losses, (e.g., power losses), due to transmission along the memory stack 220.

Additionally, each logic die 221 can include one or more sense amplifiers (SAs) that can communicate with areas of memory in a memory stack 220 not associated with that logic die. That is, the SAs in logic die $221_1$ are operatively in communication with, for example, memory areas, or cells, in memory dies $222_0$. In this manner, the SAs in logic die $221_1$ can store content from a memory area in memory dies $222_0$ to a memory area in memory dies $222_1$ and vice versa. Effectively, this allows memory areas of one memory die 222 of one memory segment to directly communicate with memory areas of another memory die 222 in another memory segment.

It should be noted that any of the functionality described above in logic dies 221 can operated separately or in conjunction with any other logic functionality. For example, in addition to providing PIM functionality, each logic die 221 can include a crossbar, or any other combination of functionality described above. Additionally, it should be noted that a logic die 221 can include logic to control multiple memory dies 222. For example, logic die $221_1$ can control memory die $222_0$ and $222_1$. The memory technologies controlled by the shared logic die $221_1$ can be similar or different memory technologies. Furthermore, although the logic dies 221 are shown as being independent dies from memory dies 222, it should be noted that a memory die 222 can include the logic to control other memory dies 222. For example, two dies can be manufactured similarly, with one die having memory logic disabled but control logic enabled, rendering it a logic die, while a similar die includes the control logic disabled and the memory logic enable, rendering it a memory die.

Although FIG. 1 and FIG. 2 show example implementations of the apparatus described above, it is to be understood that other implementations may be utilized. For example, a single processor, such as a wireless integrated circuit (IC) could receive instructions wirelessly and be in communication with any of the logic dies 221 for performing memory operations.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of IC, and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method of integrating memory stacks, comprising:
providing a first memory die of a first memory technology;
providing a first logic die in communication with the first memory die of the first memory technology, the first logic die including a first memory controller including a first memory control function for interpreting requests in accordance with a first protocol for the first memory technology;
providing a second memory die of a second memory technology;
providing a second logic die in communication with the second memory die of the second memory technology and the first memory die of the first memory technology, the second logic die including a second memory controller including a second memory control function for interpreting requests in accordance with a second protocol for the second memory technology;
receiving a memory operation request at the first memory controller from a processor via a first bus;

on a condition that the memory operation request is associated with the second logic, communicating the memory operation request to the second memory controller via a side bus, and on a condition that the memory operation request is associated with the first logic, performing the memory operation request in accordance with the first protocol.

2. The method of claim 1, wherein the memory operation request is received at both the first memory controller and the second memory controller over a sidebus connection associated with each of the first memory controller and the second memory controller.

3. The method of claim 2, wherein the memory operation request includes a request for a memory access to the first memory die or the second memory die and the first memory controller performs the memory operation request.

4. The method of claim 3, wherein the first memory controller receives the memory operation request from a processor via the sidebus connection and communicates data to the processor via the sidebus connection.

5. The method of claim 2, wherein the memory operation request includes a request for a memory access to the second memory die of the second memory technology and the second memory controller performs the memory operation request.

6. The method of claim 5, wherein the second memory controller receives the memory operation request from a processor via the sidebus connection and communicates data to the processor via the sidebus connection.

7. The method of claim 1, wherein the memory operation request is received at the first memory controller over a connection associated with the first memory controller and a processor.

8. The method of claim 7 wherein the memory operation request is associated with a memory access to the first memory die of the first memory technology and the first memory controller performs the memory operation request.

9. The method of claim 7, wherein the memory operation request is associated with a memory access to the second memory die of the second memory technology and the first memory controller communicates the memory operation request to the second memory controller.

10. The method of claim 9, wherein the second memory controller performs the memory operation request and provides data to the processor via the first memory controller.

11. The method of claim 1, further comprising associating the first memory die of the first memory technology with the second memory controller.

12. The method of claim 11, further comprising performing memory operations by the second memory controller to the first memory die of the first memory technology.

13. The method of claim 12, wherein the second memory controller transfers data from the first memory die of the first memory technology to the second memory die of the second memory technology and from the second memory die of the second memory technology to the first memory die of the first memory technology.

14. The method of claim 13, wherein the first memory die of the first memory technology is a cache for storing data from the second memory die of the second memory technology or the second memory die is a cache for storing data from the first memory die of the first memory technology.

15. The method of claim 1, wherein the first memory technology and the second memory technology include any one of the following memory technologies: dynamic random access memory (DRAM), phase-change memory (PCM), Flash memory, or static random access memory (SRAM).

16. The method of claim 15, wherein the first memory technology and the second memory technology are the same memory technology type.

17. The method of claim 15, wherein the first memory technology and the second memory technology are different memory technology types.

18. The method of claim 1, further comprising aligning a through silicon via (TSV) of a topmost memory die of the first memory technology to a logic die immediately above the topmost memory die of the first memory technology.

19. The method of claim 1, further comprising aligning a through silicon via (TSV) of a bottommost memory die of the first memory technology to a logic die immediately below the bottommost memory die of the first memory technology.

20. The method of claim 1, further comprising performing a memory test on the first memory die of the first memory technology by the first memory controller.

21. The method of claim 1, further comprising performing a memory test on the second memory die of the second memory technology by the second memory controller.

22. The method of claim 1, further comprising providing a crossbar in at least the second logic die, wherein the crossbar communicates with any memory location in a memory die of either the first memory technology or the second memory technology.

23. The method of claim 1, further comprising providing compute logic in one or both of the first logic die and the second logic die, wherein the compute logic performs computations on data that is stored in the memory stack associated with the respective first logic die or second logic die.

24. An apparatus comprising:
a first memory die of a first memory technology;
a first logic die in communication with the first memory die of the first memory technology, the first logic die including a first memory controller including a first memory control function for interpreting requests in accordance with a first protocol for the first memory technology;
a second memory die of a second memory technology; and
a second logic die in communication with the first memory die of the first memory technology and the second memory die of the second memory technology, the second logic die including a second memory controller including a second memory control function for interpreting requests in accordance with a second protocol for the second memory technology,
wherein the first memory controller:
receives a memory operation request from a processor via a first bus,
on a condition that the memory operation request is associated with the second logic, communicates the memory operation request to the second memory controller via a side bus, and
on a condition that the memory operation request is associated with the first logic, performs the memory operation request in accordance with the first protocol.

25. The apparatus of claim 24, further comprising:
a sidebus connection associated with each of the first memory controller and the second memory controller, wherein the memory operation request is received at both the first memory controller and the second memory controller over the sidebus connection.

26. The apparatus of claim 25, wherein the memory operation request includes a request for a memory access to the first memory die of the first memory technology and the first memory controller performs the memory operation request.

27. The apparatus of claim 26, wherein the first memory controller receives the memory operation request from a processor via the sidebus connection and communicates data to the processor via the sidebus connection.

28. The apparatus of claim 25, wherein the memory operation request includes a request for a memory access to the second memory die of the second memory technology and the second memory controller performs the memory operation request.

29. The apparatus of claim 28, wherein the second memory controller receives the memory operation request from a processor via the sidebus connection and communicates data to the processor via the sidebus connection.

30. The apparatus of claim 24, wherein the memory operation request is received at the first memory controller over a connection associated with the first memory controller and a processor.

31. The apparatus of claim 30 wherein the memory operation request is associated with a memory access to the first memory die of the first memory technology and the first memory controller performs the memory operation request.

32. The apparatus of claim 30, wherein the memory operation request is associated with a memory access to the second memory die of the second memory technology and the first memory controller communicates the memory operation request to the second memory controller.

33. The apparatus of claim 32, wherein the second memory controller performs the memory operation request and provides data to the processor via the first memory controller.

34. The apparatus of claim 24, wherein the first memory die of the first memory technology is associated with the second memory controller.

35. The apparatus of claim 34, wherein the second memory controller performs memory operations on the first memory die of the first memory technology.

36. The apparatus of claim 35, wherein the second memory controller transfers data from the first memory die of the first memory technology to the second memory die of the second memory technology and from the second memory die of the second memory technology to the first memory die of the first memory technology.

37. The apparatus of claim 36, wherein the first memory die of the first memory technology is a cache for storing data from the second memory die of the second memory technology or the second memory die of the second memory technology is a cache for storing data from the first memory die of the first memory technology.

38. The apparatus of claim 24, wherein the first memory technology and the second memory technology include any one of the following memory technologies: dynamic random access memory (DRAM), phase-change memory (PCM), Flash memory, or static random access memory (SRAM).

39. The apparatus of claim 38, wherein the first memory technology and the second memory technology are the same memory technology type.

40. The apparatus of claim 38, wherein the first memory technology and the second memory technology are different memory technology types.

41. The apparatus of claim 24, wherein at least the first logic die includes a sense amplifier in communication with a memory location of the second memory die of the second memory technology.

42. The apparatus of claim 24, wherein at least the first logic die includes a voltage regulator for compensating power during transmission of signals in the apparatus.

43. The apparatus of claim 24, wherein at least the first logic die includes an amplifier to amplify signals transmitted in the apparatus.

44. The apparatus of claim 24, wherein the first logic die further includes a second memory control function for interpreting requests in accordance with the second protocol for the second memory technology.

* * * * *